(12) United States Patent
Mayer et al.

(10) Patent No.: US 10,623,009 B2
(45) Date of Patent: Apr. 14, 2020

(54) FREQUENCY GENERATOR WITH TWO VOLTAGE CONTROLLED OSCILLATORS

(71) Applicant: Endress + Hauser GmbH + Co. KG, Maulburg (DE)

(72) Inventors: Winfried Mayer, Buch (DE); Martin Hitzler, Dillingen (DE); Christian Waldschmidt, Ulm (DE)

(73) Assignee: ENDRESS+HAUSER SE+CO.KG, Maulburg (DE)

( * ) Notice: Subject to any disclaimer, the term of this patent is extended or adjusted under 35 U.S.C. 154(b) by 862 days.

(21) Appl. No.: 15/132,678

(22) Filed: Apr. 19, 2016

(65) Prior Publication Data

US 2016/0315628 A1 Oct. 27, 2016

(30) Foreign Application Priority Data

Apr. 22, 2015 (DE) .................. 10 2015 106 204

(51) Int. Cl.
| | |
|---|---|
| *H03L 7/23* | (2006.01) |
| *G01F 23/284* | (2006.01) |
| *H03L 7/099* | (2006.01) |
| *G01S 7/35* | (2006.01) |
| *G01S 13/34* | (2006.01) |

(Continued)

(52) U.S. Cl.
CPC ............. *H03L 7/23* (2013.01); *G01F 23/284* (2013.01); *G01S 7/35* (2013.01); *G01S 13/345* (2013.01); *G01S 13/88* (2013.01); *H03L 7/099* (2013.01); *H03L 7/1976* (2013.01); *H03L 2207/06* (2013.01)

(58) Field of Classification Search
None
See application file for complete search history.

(56) References Cited

U.S. PATENT DOCUMENTS

| | | | |
|---|---|---|---|
| 6,040,796 A | * | 3/2000 | Matsugatani ............. G01S 7/35 342/101 |
| 2004/0131130 A1 | * | 7/2004 | Shor .................. H04B 1/71632 375/308 |

(Continued)

FOREIGN PATENT DOCUMENTS

| | | |
|---|---|---|
| DE | 102010044134 A1 | 5/2012 |
| JP | H11214992 A | 8/1999 |

*Primary Examiner* — Marcus E Windrich
(74) *Attorney, Agent, or Firm* — Bacon & Thomas, PLLC (57) ABSTRACT

A frequency generator includes two voltage controlled oscillators, which have a plurality of switchable sub-bands, each, and which are designed to produce respective frequency signals, wherein a switching from one sub-band to a neighboring sub-band occurs at predetermined switching locations. The sub-bands of the second oscillator are arranged offset in frequency relative to the sub-bands of the first oscillator. The frequency generator includes an electronic switch element, which is designed to switch either the first or the second frequency signal through to the output of the electronic switch element, and to switch the switch element such that during the producing of the frequency ramp alternately either the first or the second frequency signal is switched through to the output. When at one of the oscillators the switching between two neighboring sub-bands is occurring, the frequency signal produced by the other oscillator is switched through to the output.

17 Claims, 7 Drawing Sheets

(51) Int. Cl.
*G01S 13/88* (2006.01)
*H03L 7/197* (2006.01)

(56) References Cited

U.S. PATENT DOCUMENTS

| | | | | |
|---|---|---|---|---|
| 2012/0112806 A1* | 5/2012 | Dayi | ................... | H03L 7/089 |
| | | | | 327/145 |
| 2012/0242538 A1* | 9/2012 | Hasch | ................... | G01S 7/354 |
| | | | | 342/194 |
| 2013/0187719 A1* | 7/2013 | Beaulaton | ................... | H03L 7/099 |
| | | | | 331/16 |
| 2016/0061942 A1* | 3/2016 | Rao | ................... | G01S 7/35 |
| | | | | 342/109 |
| 2016/0112054 A1* | 4/2016 | Gonzalez Jimenez | ................... | |
| | | | | H03B 5/1228 |
| | | | | 331/18 |
| 2016/0204784 A1* | 7/2016 | Trotta | ................... | H01Q 3/30 |
| | | | | 342/354 |

* cited by examiner

FREQUENCY GENERATOR WITH TWO VOLTAGE CONTROLLED OSCILLATORS

TECHNICAL FIELD

The invention relates to a frequency generator for producing a frequency ramp as well as to a radar measurement apparatus for measuring in accordance with the principle of FMCW radar. Furthermore, the invention relates to a method for producing a frequency ramp by means of a frequency generator.

BACKGROUND DISCUSSION

Often applied in process automation technology are field devices, which serve for registering and/or influencing process variables. Examples of such field devices are fill level measuring devices, mass flow measuring devices, pressure- and temperature measuring devices, etc., which as sensors register the corresponding process variables, fill level, flow, pressure, and temperature, respectively.

In the case of many measurement applications, highly linear frequency generators are required, which are able to produce a variable frequency signal over a large frequency range. With the help of such frequency generators, highly linear frequency ramps having large frequency sweeps can be produced. For example, a highly linear frequency signal is required in the field of radar sensors, which work according to the FMCW principle (FMCW, Frequency Modulated Continuous Wave).

SUMMARY OF THE INVENTION

It is an object of the invention to provide a frequency generator as well as a method for producing a frequency ramp able to produce a highly linear frequency ramp of large bandwidth.

This object is achieved by a frequency generator for producing a frequency ramp in accordance with forms of embodiment of the invention includes a first voltage controlled oscillator, which has a plurality of switchable sub-bands and is designed to produce a first frequency signal, wherein a switching from one sub-band to a neighboring sub-band occurs at predetermined first switching locations, and a second voltage controlled oscillator, which has a plurality of switchable sub-bands and is designed to produce a second frequency signal, wherein a switching from one sub-band to a neighboring sub-band occurs at predetermined second switching locations. In such case, the sub-bands of the second voltage controlled oscillator are arranged offset in frequency relative to the sub-bands of the first voltage controlled oscillator. The frequency generator includes, moreover, an electronic switch element, which is designed either to switch the first frequency signal or the second frequency signal through to the output of the electronic switch element. The frequency generator is designed to switch the electronic switch element such that during the producing of the frequency ramp alternately either the first frequency signal or the second frequency signal is switched through to the output of the electronic switch element, wherein, in each case, when at one of the voltage controlled oscillators the switching between two neighboring sub-bands is occurring, the frequency signal produced by the respectively other voltage controlled oscillator is switched through to the output of the electronic switch element.

Voltage controlled oscillators with a number of sub-bands are well suited for producing a frequency ramp with large frequency sweep. However, disturbing instabilities occur upon the switching between the sub-bands. Therefore, two voltage controlled oscillators with sub-bands offset in frequency relative to one another are provided. By means of the electronic switch element, then, alternately, respectively, the first frequency signal produced by the first voltage controlled oscillator or the second frequency signal produced by the second voltage controlled oscillator can be switched through to the output. In each case, when at one of the voltage controlled oscillators the switching between two neighboring sub-bands is occurring, the frequency signal produced by the respectively other voltage controlled oscillator is switched through to the output of the electronic switch element. In this way, it can be achieved that the frequency ramp obtained on the output of the electronic switch element is composed only of disturbance free subsections of the first and second frequency signals. The instabilities arising upon the switching between different sub-bands are not switched through to the output of the electronic switch element. In this way, one obtains on the output of the electronic switch element a disturbance free frequency ramp, which is not degraded by switching events between sub-bands.

BRIEF DESCRIPTION OF THE DRAWINGS

The invention will now be explained in greater detail based on examples of embodiments illustrated in the drawing. The figures of the drawing show as follows.

DETAILED DISCUSSION IN CONJUNCTION WITH THE DRAWINGS

For a large number of measurement applications, it is necessary to produce highly linear frequency ramps of exactly defined slope. Different approaches are used for producing such frequency ramps.

Figure 1:
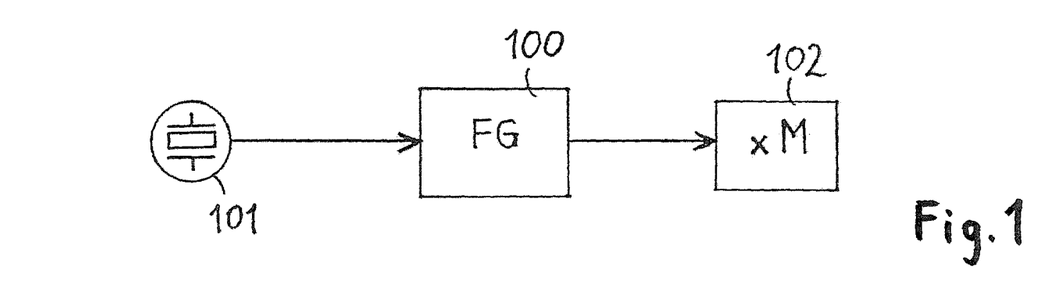
FIG. 1 is a frequency generator with subsequent frequency multiplication.

In the case of the circuit shown in FIG. 1, the high frequencies are produced with the assistance of frequency multiplication. The circuit shown in FIG. 1 includes a frequency generator 100, which includes e.g. a voltage controlled oscillator (VCO) and a phase lock loop. Provided to the frequency generator 100 from a quartz oscillator 101 is a reference signal with a frequency of, for example, 10 MHz to 100 MHz. The frequency generator 100 produces by means of the voltage controlled oscillator and the phase lock loop a frequency ramp with a frequency of, for example, 5 to 10 GHz. In order to bring the output signal of the frequency generator 100 up to the desired frequency range, a frequency multiplier 102 is provided. Frequency multiplier 102 multiplies the frequency of the output signal of the frequency generator 100 by a factor M, which can move, for example, in the range between 2 and 20. Obtained on the output of the frequency multiplier 102 is the desired frequency ramp in the frequency range between, for example, 70 GHz to 150 GHz.

Frequency multiplication has, however, the disadvantage that phase disturbances of the frequency ramp produced by the frequency generator 100 are significantly amplified by the frequency multiplier 102, so that the phase disturbances, respectively phase jitter, of the frequency multiplied signal significantly degrades the signal quality of the frequency ramp produced by means of frequency multiplication. In such case, the phase disturbances are amplified by the frequency multiplier 102 corresponding to the square of the frequency ratio of the output- and input frequencies. This highly amplified phase jitter degrades the quality of the produced frequency ramp and limits especially the signal to noise ratio of the produced signal.

Figure 2:
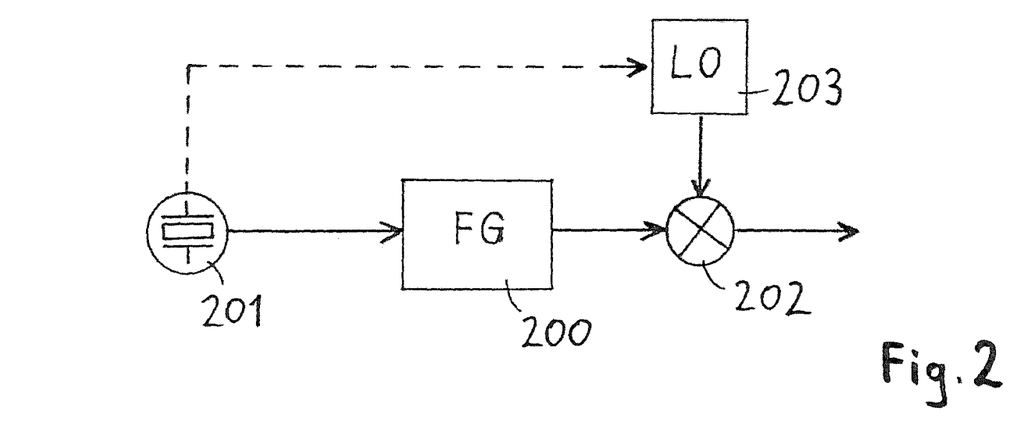
FIG. 2 is a frequency generator with a downstream frequency converter.

FIG. 2 shows an alternative circuit for producing a high-frequency ramp, in the case of which, instead of frequency multiplication, a frequency conversion is performed. The circuit includes a frequency generator 200 for producing a frequency ramp. Frequency generator 200 includes a voltage controlled oscillator (VCO) as well as a phase lock loop for control of the voltage controlled oscillator. The reference signal for the phase lock loop is provided by a quartz oscillator 201. For frequency conversion, a mixer 202 is provided, which mixes the frequency ramp produced by the frequency generator 200 up to a frequency range above 70 GHz. For this, the frequency ramp is mixed in the mixer 202 with a local oscillator signal, which is provided by a fixed frequency, local oscillator 203. The local oscillator 203 is preferably a local oscillator of high quality, which provides a local oscillator signal of frequency of 10 GHz or more.

As a result, the circuit shown in FIG. 2 delivers a higher frequency ramp, which has a significantly smaller phase jitter than the frequency ramp produced by the circuit in FIG. 1. The reason is that the noise fractions of the frequency ramp produced by the frequency generator 200 add with the (non-correlated) phase noise fractions of the local oscillator signal, so that also the higher frequency ramp has no mentionable phase disturbances. An increase of the noise proportional to the square of the frequency ratio, such as occurs in the case of the solution shown in FIG. 1, can be prevented in this way.

However, there is an additional essential difference between the multiplier solution of FIG. 1 and the converter solution of FIG. 2. In the case of the solution shown in FIG. 1, the frequency sweep of the frequency generator 100 is likewise multiplied by the frequency multiplier 102, so that one obtains on the output of the frequency multiplier 102 a frequency ramp with a frequency sweep increased by the factor M. In contrast, in the case of the solution shown in FIG. 2, the frequency sweep produced by the frequency generator 200 is obtained unchanged by the up-mixing in the mixer 202. For this reason, the frequency generator 200 in the case of the solution shown in FIG. 2 must be able to produce a frequency ramp with sufficiently high frequency sweep. Required as frequency generator 200 is, consequently, a very broadband voltage controlled oscillator of high quality, which provides an as exact as possible frequency ramp with sufficiently high frequency sweep.

Voltage controlled oscillators with switchable sub-bands are used for implementing an oscillator of high quality with broad variable frequency range. In the case of an oscillator with switchable sub-bands, a large tuning range is achieved by sequentially connecting to an oscillatable oscillator core resonators or resonator parts with successive, neighboring frequency ranges. The oscillator core forms with each resonator a voltage controlled oscillator with a small tuning range, which partially overlaps with the tuning ranges of the neighboring resonators. A voltage controlled oscillator with switchable sub-bands offers the advantage of a high quality and therewith small phase noise. The slope, respectively the steepness, of the frequency varies over the tuning range only slightly, so that a precise frequency ramp can be traveled. A disadvantage of an oscillator with switchable sub-bands is, however, the instabilities, which arise in the case of switching between neighboring sub-bands. When switching occurs between different resonators, respectively resonator parts, the phase lock loop must first be tuned anew after the switching.

Figure 3:
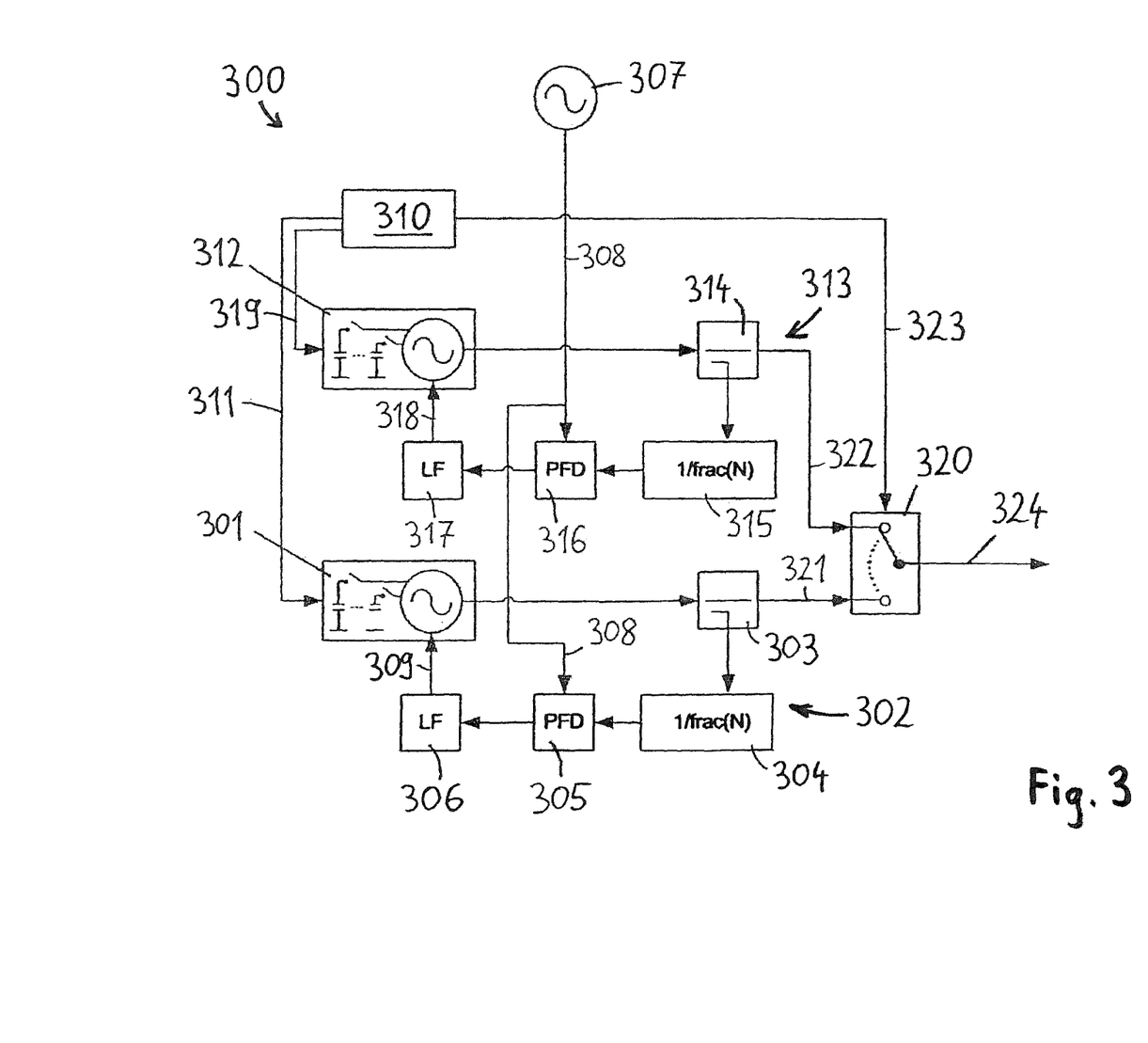
FIG. 3 is a block diagram of a frequency generator with two voltage controlled oscillators, each of which has a plurality of switchable sub-bands.

FIG. 3 shows a broadband frequency generator 300 constructed of two oscillators with switchable sub-bands and two associated phase control circuits, wherein the problems arising upon switching of sub-bands are prevented. The frequency generator 300 includes a first voltage controlled oscillator 301, which has a plurality of switchable sub-bands. The control voltage for the first voltage controlled oscillator 301 is regulated by a first phase lock loop 302.

The first phase lock loop 302 includes a signal feedback 303, a fractional-N frequency divider 304, a phase frequency detector 305 as well as a loop filter 306. Moreover, a reference oscillator 307 is provided, for example, a quartz oscillator, which provides a reference signal 308 for the first phase lock loop 302. The frequency signal produced by the first voltage controlled oscillator 301 is fed by the signal feedback 303 to the fractional-N frequency divider 304, which divides the frequency in accordance with a fractional dividing value N.

Such a fractional dividing value can be achieved by periodic switching between two or more integer dividers, so that averaged over time a desired fractional dividing value results.

The phase frequency detector 305 then compares the phase of the down divided signal with the phase of the reference signal 308. The output signal of the phase frequency detector 305 is fed to the loop filter 306, which converts it into a control voltage 309 for the first voltage controlled oscillator 301.

For producing a continuous frequency ramp, the dividing value of the fractional-N frequency divider 304 is continuously increased. An increasing of the dividing value of the fractional-N frequency divider 304 has the result that the first phase lock loop 302 accordingly continuously increases the frequency of the frequency signal produced by the first voltage controlled oscillator 301.

However, at certain predetermined frequencies, respectively at certain values of the control voltage 309, a switching between different sub-bands of the first voltage controlled oscillator 301 is required. This switching between different sub-bands is controlled by a control unit 310, which supplies the first voltage controlled oscillator 301 with a first control signal 311.

The frequency generator 300 includes, moreover, a second voltage controlled oscillator 312, which has a plurality of switchable sub-bands, as well as an associated second phase lock loop 313. The second phase lock loop 313 is designed to produce the control voltage for the second voltage controlled oscillator 312. The second phase lock loop 313 includes a signal feedback 314, a fractional-N frequency divider 315, a phase frequency detector 316 and a loop filter 317. The frequency signal produced by the second voltage controlled oscillator 312 is divided by the fractional-N frequency divider 315 by the fractional dividing value N. The phase of the down divided frequency signal is compared in the phase frequency detector 316 with the reference signal 308. The result of this comparison is converted by the loop filter 317 into a control voltage 318 for the second voltage controlled oscillator 312.

For producing a frequency ramp, the fractional dividing value N of the fractional-N frequency divider 315 is continuously increased. By continuously increasing the dividing value N, a continuous increasing of the frequency of the frequency signal produced by the second voltage controlled oscillator 312 results, so that a steadily rising frequency ramp is produced.

As in the case of the first voltage controlled oscillator 301, it is during the producing of the frequency ramp also in the case of the second voltage controlled oscillator 312 necessary at certain predetermined frequencies, respectively at certain values of the control voltage 318, to switch between different sub-bands of the second voltage controlled oscillator 312. The switching between the different sub-bands of the second voltage controlled oscillator 312 is controlled by the control unit 310, which supplies the second voltage controlled oscillator 312 with a second control signal 319.

Figure 4A:
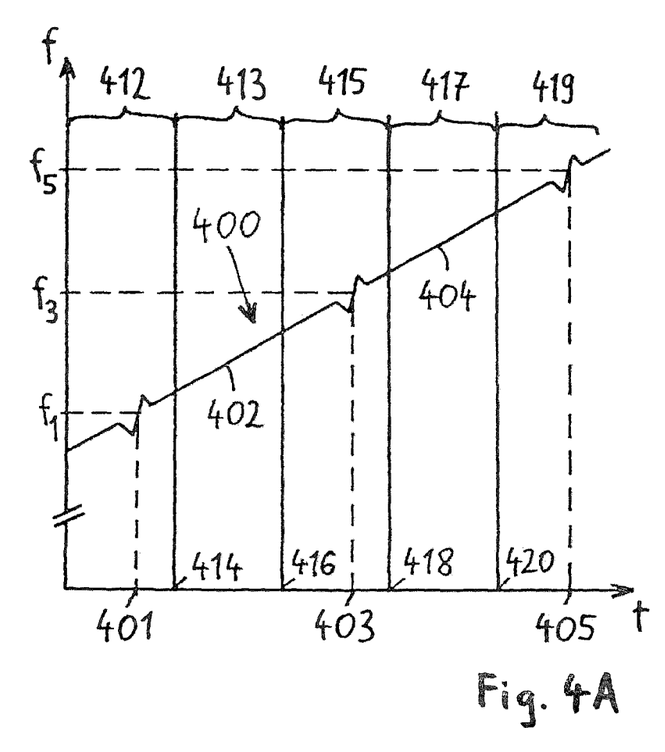
FIG. 4A shows a frequency of the frequency signal produced by the first voltage controlled oscillator as a function of time.

FIG. 4A shows the frequency ramp 400 produced by the first voltage controlled oscillator 301. Time is plotted on the horizontal axis and frequency on the vertical axis. FIG. 4A shows the locations of the frequency ramp 400 where the switching between different sub-bands occurs within the first voltage controlled oscillator 301. The switching from the first to the second sub-band occurs at the point in time 401 at the frequency $f_1$. Accordingly, an instability in the frequency ramp 400 occurs at the point in time 401. After switching from the first to the second sub-band, the frequency ramp 400 rises linearly within the section 402. The switching from the second to the third sub-band occurs at the point in time 403 at the frequency $f_3$. Also here, a location of unsteadiness occurs. In the section 404 following thereon, again a linear rise of the frequency ramp 400 occurs. At the point in time 405 at the frequency $f_5$, a switching from the third sub-band to the fourth sub-band occurs.

Figure 4B:
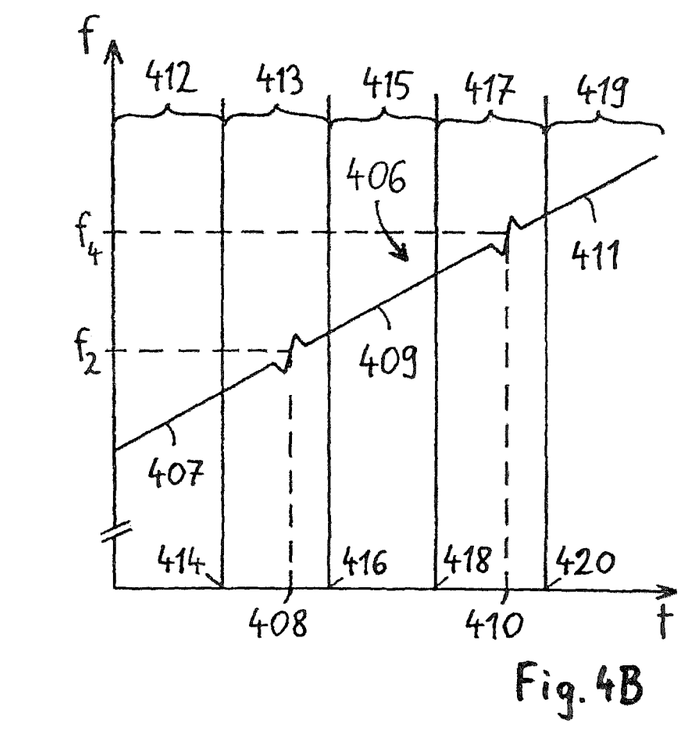
FIG. 4B shows a frequency of the frequency signal produced by the second voltage controlled oscillator as a function of time.

FIG. 4B shows the frequency ramp 406 produced by the second voltage controlled oscillator 312. Plotted on the horizontal axis is time and on the vertical axis frequency. FIG. 4B shows that the sub-bands of the second voltage controlled oscillator 312 are shifted in frequency compared with the sub-bands of the first voltage controlled oscillator 301. Frequency ramp 406 includes, first of all, a section 407, in which frequency rises linearly with time. The switching from the first sub-band to the second sub-band occurs at the point in time 408 at the frequency $f_2$. Then, there follows a section 409, in which the frequency rises linearly with time. The switching from the second to the third sub-band occurs at the point in time 410 at the frequency $f_4$. Then, there follows in the section 411 a further linear rise of the frequency with time.

A comparison of FIG. 4A and FIG. 4B shows that the sub-bands of the second voltage controlled oscillator 312 are arranged shifted in frequency compared with the sub-bands of the first voltage controlled oscillator 301. The switching of the sub-bands of the second voltage controlled oscillator 312 occurs at points in time 408, 410 and, thus, exactly when the first voltage controlled oscillator 301 is delivering a uniform, linear rise of the frequency ramp. On the other hand, the switching of the sub-bands of the first voltage controlled oscillator 301 occurs exactly at points in time 401, 403, 405, when the second voltage controlled oscillator 312 is delivering a regular, linear rise of the frequency ramp 406.

As a result, it is possible to combine from the subsections of the two frequency ramps 400, 406 a frequency ramp, which has no instability locations. To this end, the frequency generator 300 shown in FIG. 3 includes an electronic toggle switch 320, to which are fed both the first frequency signal 321 produced by the first voltage controlled oscillator 301 as well as also the second frequency signal 322 produced by the second voltage controlled oscillator 312. The electronic toggle switch 320 is controlled by a switching signal 323, which is provided by the control unit 310. Corresponding to the switching signal 323, one of the two frequency signals 321, 322 is selected and switched through to the output 324 of the electronic toggle switch 320.

The electronic toggle switch 320 can be implemented, for example, by means of switching diodes, especially by means of PIN diodes, or e.g. by means of transistors or field effect transistors. Alternatively, e.g. a switchable amplifier can be applied as electronic toggle switch 320.

In this way, it is possible while moving along the frequency ramp to select for a certain subsection of the frequency ramp that frequency signal, which has no instability locations within the respective subsection. Always when at one of the two voltage controlled oscillators 301, 312 a switching from one sub-band to a neighboring sub-band is happening, which leads to a corresponding instability in the frequency ramp, the frequency signal produced by the respectively other voltage controlled oscillator is switched through to the output 324. By suitable combining of disturbance free subsections of the frequency ramps delivered by the two voltage controlled oscillators 301, 312, a disturbance free frequency ramp of different subsections is assembled.

Figure 4C:
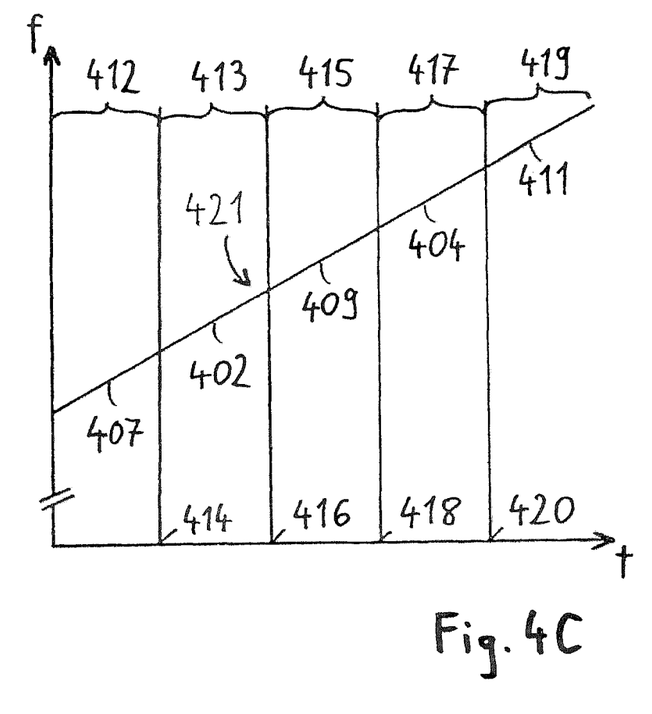
FIG. 4C shows the disturbance free frequency ramp obtained on the output of the electronic toggle switch.

The selection of suitable subsections is illustrated in FIGS. 4A, 4B, 4C. In subsection 412, the first frequency ramp 400 has a location of unsteadiness at the frequency $f_1$. The location of unsteadiness is caused by switching from the first to the second sub-band of the first voltage controlled oscillator 301. Therefore, the electronic toggle switch 320 during subsection 412 switches the second frequency ramp 406 through to the output 324. During the subsection 413 following thereon, the second frequency ramp 406 has, however, a location of unsteadiness at the frequency $f_2$. Therefore, during subsection 413, the first frequency ramp 400 is switched through to the output 324. Therefore, the electronic toggle switch 320 at the point in time 414 is switched from the second frequency signal 322 to the first frequency signal 321. The first frequency ramp 400 has, however, a location of unsteadiness at the frequency $f_3$. Therefore, during subsection 415, again the second frequency ramp 406 is switched through to the output 324, wherein the electronic toggle switch 320 is switched at the point in time 416. In order to avoid the instability at the frequency $f_4$, during the subsection 417 following thereon, again the first frequency ramp 400 is switched through to the output 324. To this end, there occurs at the point in time 418 a switching from the second frequency signal 322 to the first frequency signal 321. During subsection 419, because of the location of unsteadiness at the frequency $f_5$, again the second frequency ramp 406 is switched through to the output 324. Thus, there occurs at the point in time 420 a switching from the first frequency signal 321 to the second frequency signal 322.

FIG. 4C shows the frequency ramp 421 obtained on the output 324 of the electronic toggle switch 320. Time is plotted on the horizontal axis and frequency on the vertical axis. As above described, the frequency ramp 421 is produced by repeated switching of the electronic toggle switch 320 between the two frequency signals 321, 322. During subsections 412, 415, 419, the second frequency signal 322 is switched through to the output 324, and during subsections 413, 417 the first frequency signal 321 is switched through to the output 324.

With the aid of two voltage controlled oscillators 301, 312 having sub-bands shifted relative to one another, a broad-banded and nevertheless disturbance free frequency ramp 421 can be produced. In such case, the selecting of subsections occurs such that, in each case, when at one of the two voltage controlled oscillators a switching procedure between neighboring sub-bands is occurring, the frequency signal produced by the respectively other voltage controlled oscillator is switched through to the output 324 of the frequency generator 300. During switching between two sub-bands, the particular voltage controlled oscillator, in the case of which the switching is occurring, thus is isolated from the output 324.

Figure 5:
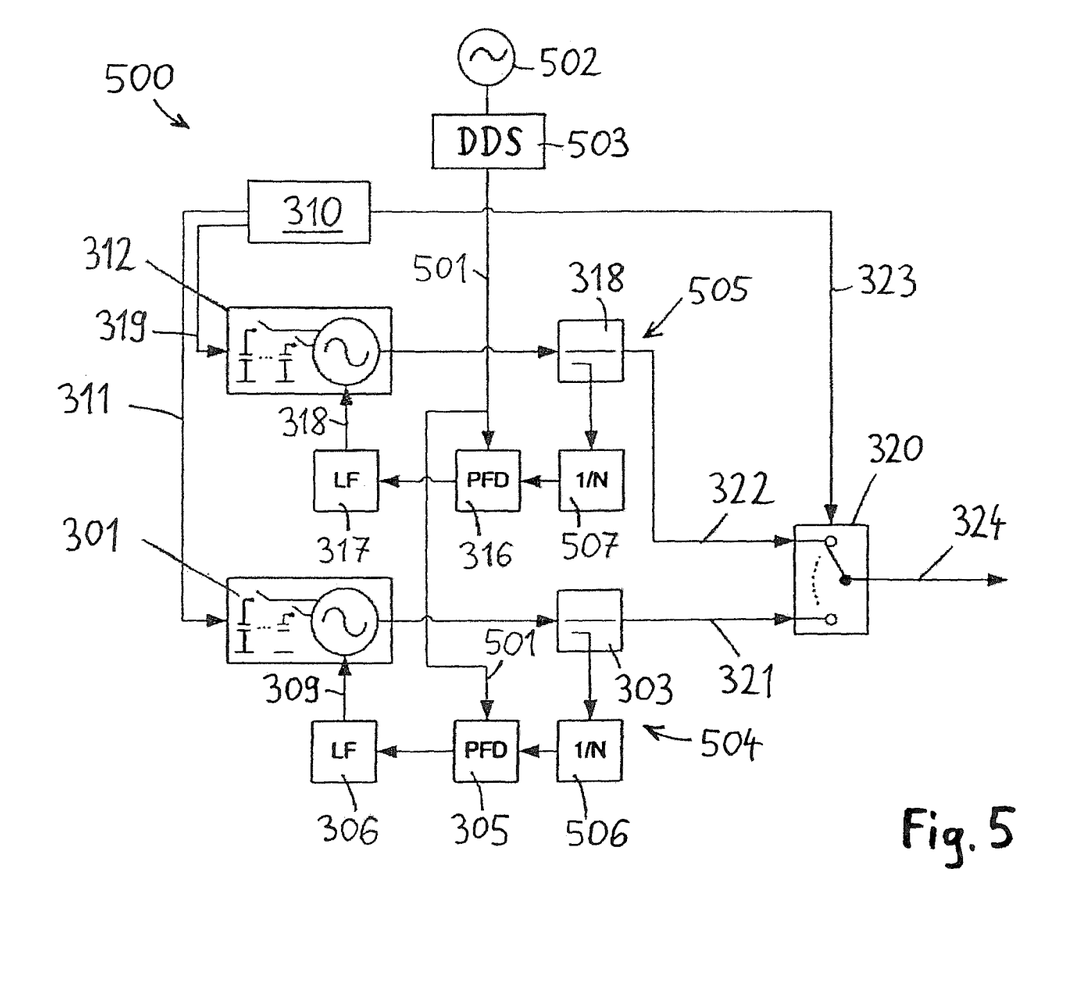
FIG. 5 is a further block diagram of a frequency generator with two voltage controlled oscillators, each of which has a plurality of switchable sub-bands.

In the case of the frequency generator 300 shown in FIG. 3, for producing the frequency ramp, the rational fractional divider ratio of the two fractional-N dividers 304, 315 is continuously increased, in order, in this way, to produce a corresponding continuous rise of the frequency of the two frequency signals 321, 322. Alternatively, FIG. 5 shows a frequency generator 500, in the case of which for producing the frequency ramp the frequency of the reference signal 501 is increased continuously as a function of time. In FIG. 5, equal or functionally corresponding components are referred to with the same reference characters as in FIG. 3.

In the case of the solution shown in FIG. 5, the reference oscillator comprises a quartz oscillator 502 and a direct digital synthesis (DDS) chip 503, which is placed downstream from the quartz oscillator 502. The DDS chip 503 enables a conversion of the fixed frequency of the oscillator signal delivered by the quartz oscillator 502 into a continuously rising frequency of the reference signal 501. With help of the DDS chip 503, the frequency of the reference signal 501 can be controlled very exactly. Especially, by suitable changing of the register value of the DDS chip 503, a reference signal 501 rising linearly in frequency can be produced, which is provided to both the first phase lock loop 504 as well as also to the second phase lock loop 505 of the frequency generator 500.

Also in FIG. 5, the two phase control circuits 504, 505 have respective frequency dividers 506, 507. In contrast to the solution shown in FIG. 3, the two frequency divider 506, 507 divide the particular input signal with a fixed dividing value. The first, respectively second, frequency signals obtained via the two signal feedbacks 303, 314 are divided by the two frequency dividers 506, 507 corresponding to the integer value N, and the frequency divided signals are fed to the respective phase frequency detectors 305, 316. There, the frequency divided signal is compared with the reference signal 501 linearly increasing in frequency. Based on the comparison, the control voltages 309, 318 to the first voltage controlled oscillator 301 and the second voltage controlled oscillator 312 are so increased that the two frequency signals 321, 322 produced by the voltage controlled oscillators 301, 312 experience a linear frequency increase.

The two frequency signals 321, 322 are fed to the electronic switch element 320. As a function of the switching signal 323 alternately the first frequency signal 321 or the second frequency signal 322 is switched through to the output 324 of the electronic toggle switch 320. The switching of the electronic toggle switch 320 occurs, in such case, such that respectively disturbance free subsections of the first frequency signal 321 and the second frequency signal 322 are composed to form a disturbance free, frequency ramp tappable on the output 324. In order to obtain a disturbance free frequency ramp, if at one of the two voltage controlled oscillators 301, 312 a switching between neighboring sub-bands is occurring, the frequency signal of the respectively other voltage controlled oscillator is switched through to the output 324.

Figure 6:
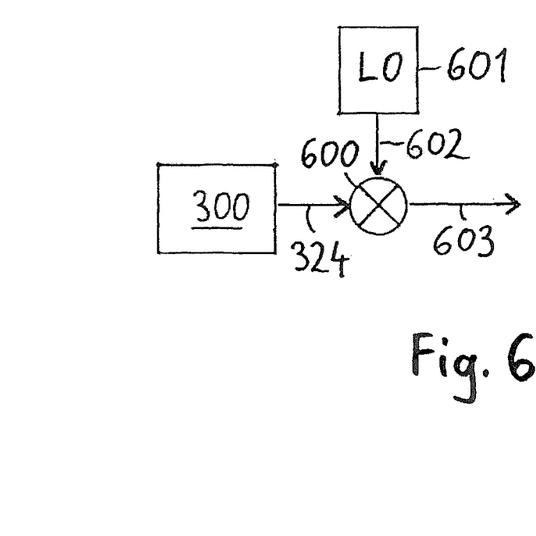
FIG. 6 shows the converting the frequency ramp obtained on the output of the frequency generator into a higher frequency range using a local oscillator.

FIG. 6 shows how the frequency ramp obtained on the output 324 of the frequency generator 300 (or of the frequency generator 500) is increased into a higher frequency region by means of a mixer 600 and a local oscillator 601. For this, the local oscillator 601 produces a local oscillator signal 602 with a frequency in the region above 10 GHz. In the mixer 600, the frequency ramp obtained on the output 324 is mixed with the local oscillator signal 602.

Preferably, the local oscillator 602 is a local oscillator of high quality. For this, the local oscillator 602 can be implemented, for example, by means of a dielectric resonator (DRO, dielectric resonator oscillator). A dielectric resonator is e.g. a ceramic component processing a sharp resonant frequency. Alternatively, an oscillator of high quality can be implemented by means of a SAW (surface acoustic wave) oscillator. In the case of a SAW oscillator, used as resonator structure is an acoustic surface wave, which propagates on the surface of a piezo crystal. Another option is use of a BAW oscillator, wherein BAW stands for "bulk acoustic wave". The operation is comparable with that of a surface wave oscillator (SAW oscillator), however, with the difference that in the case of the BAW oscillator the propagation of the acoustic wave occurs in the substrate (bulk). Another opportunity is use of cavity resonators.

One obtains on the output 603 of the mixer 600 a frequency ramp of increased frequency. This increased frequency ramp can either be directly used as radar transmission signal or, however, optionally fed to a frequency multiplier of comparatively little multiplication factor, which increases the frequency yet again by a factor M of e.g. M=2 or M=4.

The so produced frequency ramp is suited especially (however, not only) for application in the field of FMCW radar. In the case of distance measurement by means of radar according to the FMCW (Frequency Modulated Continuous Wave) principle, a frequency modulated radar signal is transmitted in continuous wave operation and reflected on the respective target. The reflected signal is received by the distance sensor and evaluated. Such radar sensors are preferably operated at higher operation frequencies, for example, 70 GHz to 150 GHz. At these highs frequencies, a high beam focusing can be implemented at increasingly smaller antenna dimensions. Since in the case of higher operation frequencies also greater absolute bandwidths are possible, additionally the distance resolution can be significantly increased. Especially in the case of radar fill level sensors, with the application of higher operation frequencies and greater absolute bandwidths, reliability in containers with complex installed objects can be significantly improved.

Figure 7:
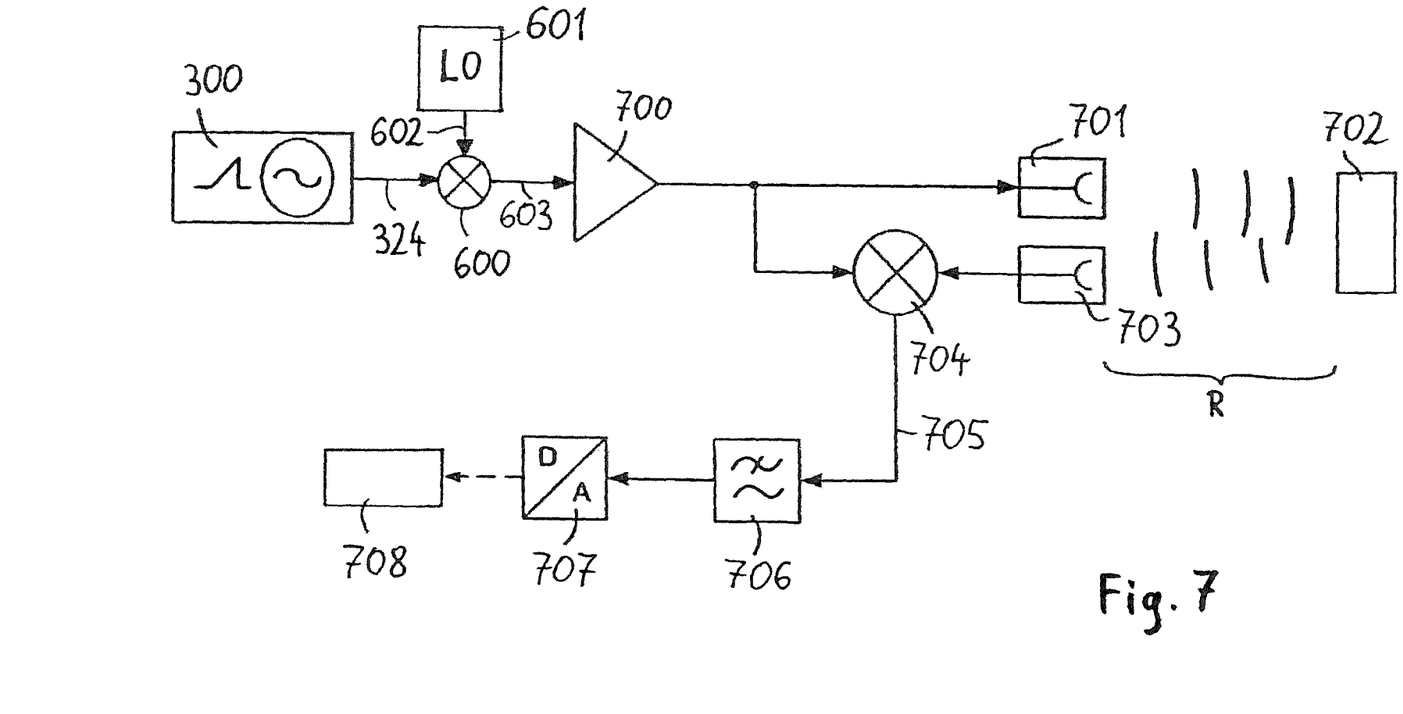
FIG. 7 is a block diagram of a radar sensor working according to the FMCW principle.

FIG. 7 shows a block diagram of a distance sensor working according to the FMCW principle. The transmitting branch of the distance sensor includes the frequency generator 300, on whose output 324 a frequency ramp is tappable. Instead of the frequency generator 300, also the frequency generator 500 could be used. The so produced frequency ramp is fed to the mixer 600, which mixes it with a local oscillator signal 602 provided by the local oscillator 601. On the output 603 of the mixer 600, one obtains an increased frequency ramp. The increased frequency ramp is amplified by an amplifier 700 and then fed to a transmitting port 701. The frequency modulated radar transmission signal is radiated via the transmitting port 701.

Figure 8:
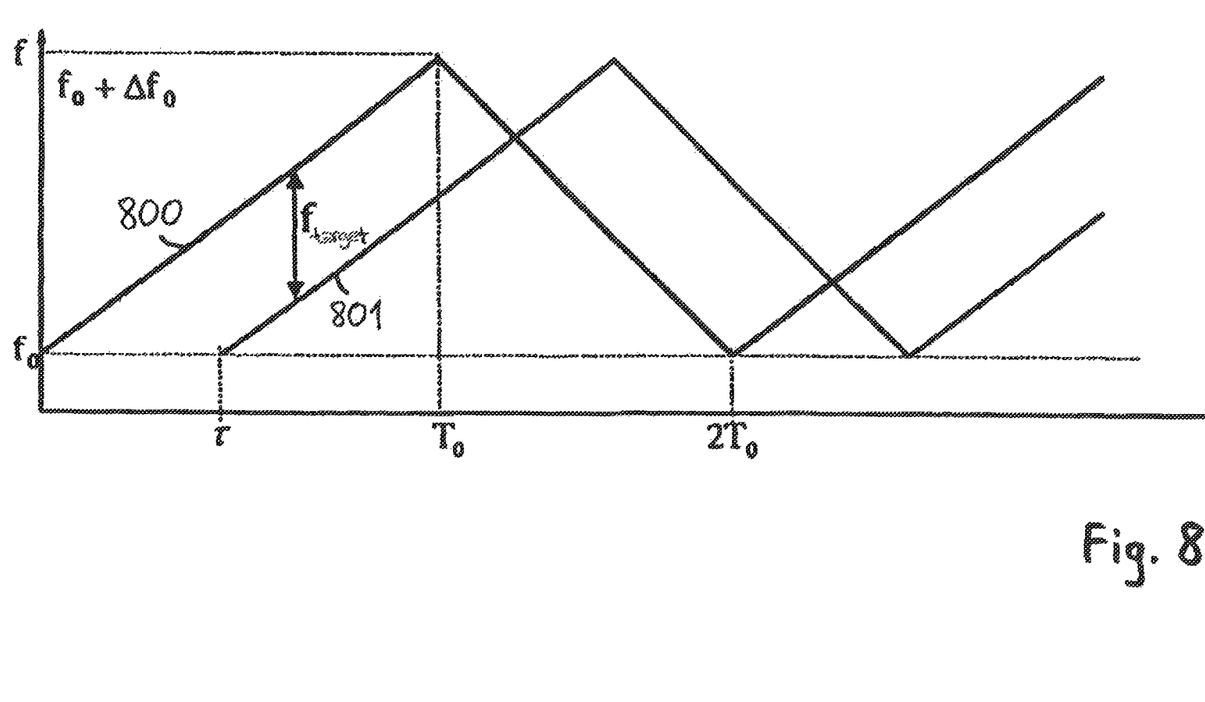
FIG. 8 shows the transmitted and received signals as a function of time.

FIG. 8 shows frequency of the produced transmission signal 800 as a function of time. The frequency of the transmission signal 800 alternately linearly rises and sinks, so that, as a whole, a triangular curve results. During a first modulation period length $T_0$, the frequency of the transmission signal increases linearly from the frequency $f_0$ to the frequency $f_0+\Delta f_0$, wherein the variable $\Delta f_0$ is referred to as the frequency sweep. During a second modulation period of length $T_0$ following thereon, the frequency falls linearly from $f_0+\Delta f_0$ back to $f_0$. Alternatively to the triangular curve, the frequency of the transmission signal could also have a sawtooth-shaped frequency curve.

The frequencies of radar transmission signals are, for example, in the range of about 20 GHz to 150 GHz. The frequency sweep $\Delta f_0$ could be, for example, several GHz. The modulation period length could be selected, for example, from the range between, for instance, 0.1 msec and 5 msec. These data serve only for illustrating typical orders of magnitude. Thus, for example, also solutions outside these ranges are possible.

As shown in FIG. 7, a part of the radiated transmission signal is reflected back to the distance sensor by a target 702 located a distance R from the distance sensor. The reflected signal is received by the receiving port 703 of the distance sensor and fed to a receiving mixer 704. In the receiving mixer 704, the received signal is mixed with the instantaneously transmitted transmission signal. For the path from the transmitting port 701 to the target 702 and back to the receiving port 703, the radar signal requires a travel time τ.

FIG. 8 shows supplementally to the transmission signal 800 also the received signal 801 delayed by the travel time τ time. During the travel time τ required by the radar signal, the transmission signal 800 produced by the signal generator rises further, so that the frequency of the instantaneously radiated transmission signal is higher than the frequency of the received signal. As a result of the travel time τ of the radar signal, there is obtained, consequently, characteristic of the travel time τ and therewith the distance to the target a frequency difference between transmitting- and received signal, which is referred to as the target frequency $f_{target}$. The target frequency $f_{target}$ is likewise indicated in FIG. 8.

In such case, a direct proportionality between the target frequency $f_{target}$ and the associated distance to the target R results. The mixer signal 705 produced by the receiving mixer 704 in FIG. 7 contains, consequently, target frequency components for one or more targets, for which the respectively associated target distances can be determined.

The mixer signal 705 is filtered by a sampling lowpass 706, which suppresses frequency components above a limit frequency. The sampling lowpass 706 limits the bandwidth of the mixer signal 705 before the digitizing. Moreover, the limit frequency fixes a maximum distance $R_{max}$ to the target. The lowpass filtered, mixer signal is sampled by an analog to digital converter 707 and digitized. The so obtained sample values are fed for evaluation to the digital signal processing unit 708, which acertains, for example, by means of a Fourier transformation (Fast Fourier Transform, FFT), the target frequency components contained in the mixer signal.

The invention claimed is:

1. A frequency generator for producing a frequency ramp, comprising:
   a first voltage controlled oscillator, which has a plurality of switchable sub-bands and is designed to produce a first frequency signal, wherein a control unit is embodied to switch from one sub-band to a neighboring sub-band at predetermined first switching locations;
   a second voltage controlled oscillator, which has a plurality of switchable sub-bands and is designed to produce a second frequency signal, wherein the control unit is embodied to switch from one sub-band to a neighboring sub-band at predetermined second switching locations, wherein the sub-bands of said second voltage controlled oscillator are arranged offset in frequency relative to the sub-bands of said first voltage controlled oscillator;
   an electronic switch element, which is designed to switch either said first frequency signal or said second frequency signal through to the output of said electronic switch element, wherein:
   said control unit is designed to switch said electronic switch element such that during the producing of said frequency ramp alternately either said first frequency signal or said second frequency signal is switched through to said output of said electronic switch element;
   in each case, when the control unit switches one of the voltage controlled oscillators between two neighboring sub-bands, the control unit switches the frequency signal produced by the respectively other voltage controlled oscillator through to said output of said electronic switch element.

2. The frequency generator as claimed in claim 1, wherein:
   at least one of the following applies:
   the frequency generator is designed to control said electronic switch element such that, in each case, when within a subsection of the frequency ramp at a voltage controlled oscillator the switching between two sub-bands is occurring, a disturbance free subsection of the frequency signal of the other voltage controlled oscillator is switched through to the output of the electronic switch element;
   the frequency generator is designed by means of said electronic switch element alternately to switch, in each case, disturbance free subsections of the first and second frequency signals through to the output of the electronic switch element and to compose from these disturbances free subsections a disturbance free frequency ramp; and
   the frequency generator is designed to switch said electronic switch element such that disturbance burdened subsections of the first and second frequency signals are not switched through to the output of the electronic switch element.

3. The frequency generator as claimed in claim 1, wherein:
   at said first voltage controlled oscillator the switching between neighboring sub-bands occurs at frequencies, at which said second voltage controlled oscillator delivers a disturbance free frequency signal, and that at said second voltage controlled oscillator the switching between neighboring sub-bands occurs at frequencies, at which said first voltage controlled oscillator delivers a disturbance free frequency signal.

4. The frequency generator as claimed in claim 1, wherein:
at least one of the following applies:
the frequency generator is designed to cause a switching of said electronic switch element between the first and second frequency signals at certain predetermined values of the frequency of the frequency ramp;
the frequency generator is designed to cause a switching of said electronic switch element between the first and second frequency signals at certain predetermined values of a control voltage applied to the first or the second voltage controlled oscillator; and
the frequency generator is designed to control the switching of said electronic switch element between the first and second frequency signals as a function of time during the producing of the frequency ramp.

5. The frequency generator as claimed in claim 1, wherein:
at least one of the following applies:
the frequency generator includes a first phase lock loop for controlling the frequency of said first voltage controlled oscillator, wherein said first phase lock loop is designed to compare the frequency signal produced by said first voltage controlled oscillator or a signal derived therefrom with a reference signal and to produce a control voltage for said first voltage controlled oscillator; and
the frequency generator includes a second phase lock loop for controlling the frequency of said second voltage controlled oscillator, wherein said second phase lock loop is designed to compare the frequency signal produced by said second voltage controlled oscillator or a signal derived therefrom with a reference signal and to produce a control voltage for said second voltage controlled oscillator.

6. The frequency generator as claimed in claim 5, wherein:
said first phase lock loop and said second phase lock loop each have:
a signal feedback, which feedsback the frequency signal produced by the respective voltage controlled oscillator;
a phase detector, which detects a phase relationship of the frequency signal or a signal derived therefrom relative to the reference signal and converts such into an electrical variable proportional to the phase deviation; and
a loop filter, which converts the electrical variable proportional to the phase deviation into a control voltage for the respective voltage controlled oscillator and feeds such thereto.

7. The frequency generator as claimed in claim 5, wherein:
the frequency generator includes for producing a reference signal a reference oscillator, which is designed to provide the first phase lock loop and the second phase lock loop with a reference signal.

8. The frequency generator as claimed in claim 7, wherein:
said reference oscillator is embodied to produce a reference signal of constant frequency.

9. The frequency generator as claimed in claim 7, wherein:
said reference oscillator is designed to produce a reference signal with frequency rising as a function of time.

10. The frequency generator as claimed in claim 9, wherein:
at least one of the following applies:
said reference oscillator includes a quartz oscillator and a downstream direct digital synthesis (DDS) chip, wherein the direct digital synthesis (DDS) chip is so controllable that the reference oscillator produces a reference signal with frequency rising as a function of time; and
said first and second phase lock loops are designed to increase the frequency of the first and second frequency signals continuously corresponding to the rise of the frequency of the reference signal.

11. The frequency generator as claimed in claim 5, wherein:
said first phase lock loop includes a first frequency divider, which is designed to divide the frequency of the first frequency signal corresponding to a variable rational fractional divider ratio to produce a first frequency divided signal and to supply such to the phase detector of the first phase lock loop; and
said second phase lock loop includes a second frequency divider, which is designed to divide the frequency of the second frequency signal corresponding to a variable rational fractional divider ratio to produce a second frequency divided signal and to supply such to the phase detector of the second phase lock loop.

12. The frequency generator as claimed in claim 11, wherein:
at least one of the following applies:
the frequency generator is designed to produce the frequency ramp by continual increasing of the divider ratio of the first and second frequency dividers;
the frequency generator is designed to increase the divider ratio of the first and second frequency dividers continuously as a function of time; and
said first and second phase lock loops are accordingly designed to increase the frequency of the first and second frequency signals continuously.

13. The frequency generator as claimed in claim 1, wherein:
the frequency generator further comprises:
a local oscillator, which is designed to produce a local oscillator signal, and
a mixer, which is designed to mix the frequency ramp obtained on the output of the electronic switch element with the local oscillator signal and to produce an increased frequency ramp.

14. The frequency generator as claimed in claim 13, wherein:
at least one of the following applies:
the local oscillator is an oscillator having a quality factor of greater than 80;
said local oscillator is implemented by means of one of the following: dielectric resonator, cavity resonator, surface acoustic wave (SAW) oscillator, bulk acoustic wave (BAW) oscillator;
the frequency generator is arranged in the transmission path of a radar sensor; and
said mixer and said local oscillator are designed to increase the frequency ramp to a radar signal range above 70 GHz.

15. A radar measurement apparatus for a measuring according to the FMCW radar principle, comprising:

a radar transmission path, which includes a frequency generator, comprising: a first voltage controlled oscillator, which has a plurality of switchable sub-bands and is designed to produce a first frequency signal, wherein a switching from one sub-band to a neighboring sub-band occurs at predetermined first switching locations; a second voltage controlled oscillator, which has a plurality of switchable sub-bands and is designed to produce a second frequency signal, wherein a switching from one sub-band to a neighboring sub-band occurs at predetermined second switching locations, wherein the sub-bands of said second voltage controlled oscillator are arranged offset in frequency relative to the sub-bands of said first voltage controlled oscillator; an electronic switch element, which is designed to switch either said first frequency signal or said second frequency signal through to the output of said electronic switch element, wherein: said frequency generator is designed to switch said electronic switch element such that during the producing of said frequency ramp alternately either said first frequency signal or said second frequency signal is switched through to said output of said electronic switch element; in each case, when at one of the voltage controlled oscillators the switching between two neighboring sub-bands is occurring, the frequency signal produced by the respectively other voltage controlled oscillator is switched through to said output of said electronic switch element; and is designed to produce and to transmit a radar transmission signal; and a radar receiving path, which is designed to receive and to evaluate a radar transmission signal reflected back on at least one target as received signal.

16. The radar measurement apparatus as claimed in claim 15, wherein:

at least one of the following applies:

the radar measurement apparatus is a distance measuring device;

the radar measurement apparatus is a fill-level measuring device;

the radar measurement apparatus is a field device for process automation technology; and the radar measurement apparatus is a field device for measuring fill level.

17. A method for producing a frequency ramp by means of a frequency generator, wherein the generator comprises: a first voltage controlled oscillator, which has a plurality of switchable sub-bands and is designed to produce a first frequency signal, wherein a control unit switches from one sub-band to a neighboring sub-band occurs at predetermined first switching locations, a second voltage controlled oscillator, which has a plurality of switchable sub-bands and is designed to produce a second frequency signal, wherein the control unit switches from one sub-band to a neighboring sub-band occurs at predetermined second switching locations, wherein the sub-bands of the second voltage controlled oscillator are arranged offset in frequency relative to the sub-bands of the first voltage controlled oscillator, and an electronic switch element, which is designed to switch either the first frequency signal or the second frequency signal through to the output of the electronic switch element, wherein the method comprises the steps as follows:

alternatingly connecting the first frequency signal and the second frequency signal through to the output of the electronic switch element by means of the electronic switch element, wherein:

in each case, when at one of the voltage controlled oscillators switching between two neighboring sub-bands is occurring, the frequency signal produced by the respectively other voltage controlled oscillator is switched through to the output of the electronic switch element.

* * * * *